(12) United States Patent
Wang

(10) Patent No.: US 10,014,131 B2
(45) Date of Patent: Jul. 3, 2018

(54) DOME SWITCH WITH NOISE-FORCE DAMPENING PAD

(71) Applicant: Apple Inc., Cupertino, CA (US)

(72) Inventor: Paul X. Wang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/269,708

(22) Filed: Sep. 19, 2016

(65) Prior Publication Data

US 2017/0083054 A1 Mar. 23, 2017

Related U.S. Application Data

(60) Provisional application No. 62/222,170, filed on Sep. 22, 2015.

(51) Int. Cl.
| | |
|---|---|
| *H01H 13/705* | (2006.01) |
| *H01H 13/14* | (2006.01) |
| *G06F 1/16* | (2006.01) |
| *H01H 13/704* | (2006.01) |
| *H01H 13/88* | (2006.01) |
| *H01H 13/50* | (2006.01) |
| *H05K 5/00* | (2006.01) |

(52) U.S. Cl.
CPC .............. *H01H 13/14* (2013.01); *G06F 1/169* (2013.01); *G06F 1/1662* (2013.01); *H01H 13/503* (2013.01); *H01H 13/704* (2013.01); *H01H 13/705* (2013.01); *H01H 13/88* (2013.01); *H05K 5/0086* (2013.01); *H01H 2215/004* (2013.01); *H01H 2225/018* (2013.01)

(58) Field of Classification Search
CPC ........ H01H 13/14; H01H 13/12; H01H 13/22; H01H 13/26; H01H 13/48; H01H 13/36; H01H 5/00; H01H 2215/03; H01H 2211/006; H01H 2211/032; H01H 2205/00; H01H 2205/002; H01H 2221/062; G06F 1/1662; G06F 1/1684
USPC ......................................... 200/406, 516, 402
See application file for complete search history.

(56) References Cited

U.S. PATENT DOCUMENTS

| | | | | |
|---|---|---|---|---|
| 4,331,851 A | * | 5/1982 | Johnson ............... | H01H 1/5805 200/302.2 |
| 4,803,321 A | * | 2/1989 | Lefebvre ............... | H01H 13/48 200/294 |
| 5,199,557 A | * | 4/1993 | Brandt ............... | H01H 11/0056 200/288 |
| 7,674,003 B2 | | 3/2010 | Sharrah et al. | |
| 7,902,474 B2 | | 3/2011 | Mittleman et al. | |

(Continued)

*Primary Examiner* — Vanessa Girardi
(74) *Attorney, Agent, or Firm* — Dickinson Wright RLLP

(57) ABSTRACT

This application relates to a dome switch assembly including a base plate that carries a first contact, and a flexible surface connected to the base plate, the flexible surface formed of a metal material in the shape of a dome. The assembly can include a second contact coupled to the flexible surface, and a sound-dampening pad coupled to the flexible surface and formed of a material having noise-dampening properties, wherein when at least a threshold amount pressure is applied to the flexible surface, the flexible surface changes from the dome shape to a collapsed shape allowing the first and second contact to touch, wherein the sound dampening pad absorbs at least some acoustic energy emitted by the touching of the first and second contacts.

20 Claims, 8 Drawing Sheets

(56) References Cited

U.S. PATENT DOCUMENTS 8,325,137 B2 * 12/2012 Maroun .............. G06F 3/03543
                                                    345/163
9,012,795 B2    4/2015 Niu

* cited by examiner

DOME SWITCH WITH NOISE-FORCE DAMPENING PAD

CROSS-REFERENCE TO RELATED APPLICATIONS

This application claims the benefit of U.S. Provisional Application No. 62/222,170, entitled "MULTIPLE FUNCTION SWITCH WITH MECHANICAL FEEDBACK" filed Sep. 22, 2015, which is incorporated by reference herein in its entirety.

FIELD

The described embodiments relate generally to switches. More particularly, the embodiments relate to switches that can include features for minimizing noise and forces generated by operation of components within the switch.

BACKGROUND

Electronic devices incorporate a variety of electrical components that can each provide different functions. A user's experience with an electronic device is one critical aspect of the operation and desirability of the electronic device. Noise generated by mechanical operation of components such as switches can detract from the user experience. For example, in some occasions noise from switches can lead to annoyance in using the electronic device in quiet environments. It is therefore desirable to reduce noise generated by components of the device where possible.

SUMMARY

Some embodiments can include a dome switch assembly including a base plate that carries a first contact, and a flexible surface connected to the base plate, the flexible surface formed of a metal material in the shape of a dome. The assembly can include a second contact coupled to the flexible surface, and a sound-dampening pad coupled to the flexible surface and formed of a material having noise-dampening properties, wherein when at least a threshold amount pressure is applied to the flexible surface, the flexible surface changes from the dome shape to a collapsed shape allowing the first and second contact to touch, wherein the sound dampening pad absorbs at least some acoustic energy emitted by the touching of the first and second contacts.

Some embodiments can include a computing device having a processor, a housing configured to carry the processor, and a dome switch in communication with the processor. The dome switch can include a flexible surface coupled to a switch base, the flexible surface having a dome shape and configured to change to a collapsed shape under a force of pressure, a first contact coupled to the flexible surface and configured to strike a second contact arranged opposite the first contact when the flexible surface changes to the collapsed shape to complete a circuit, and a noise-dampening pad coupled to the flexible surface and configured to absorb acoustical energy released when the first contact strikes the second contact.

Some embodiments can include a method for assembling a dome switch including, arranging a first contact carried by a collapsible metal dome opposite a second contact, the collapsible metal dome being configured to collapse under an applied force allowing the first and second contacts to touch, electrically coupling the first contact and second contact to a process such that when the contacts touch a circuit is completed and a signal is sent to the processor, and coupling a sound dampening pad to the flexible dome, the sound dampening pad being formed of a material having sound-dampening characteristics and configured to absorb acoustical energy released when the first contact touches the second contact due to the collapsing of the metal dome under an applied pressure.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

Figure 1A:
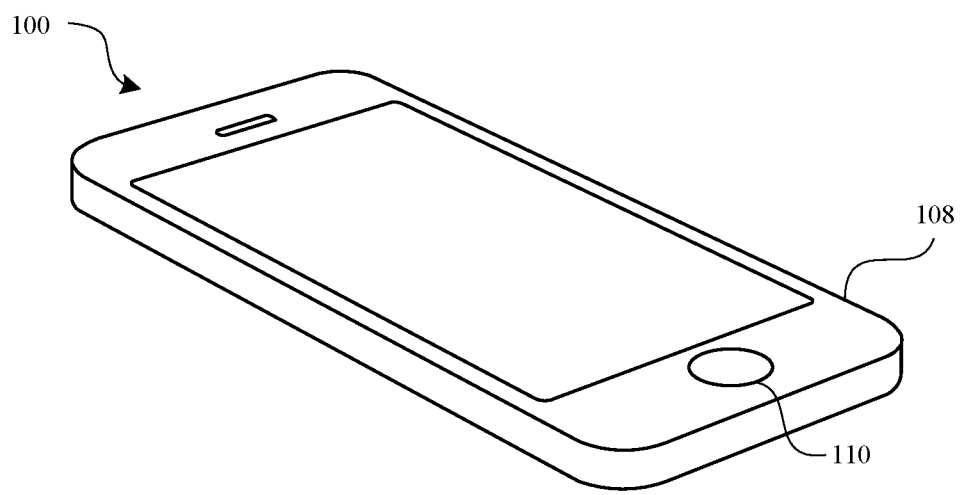
FIG. 1A illustrates an exemplary computing device using the switch of the present invention in accordance with the various embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

Many computing devices have been designed to be more compact while also increasing functionality of the computing devices. Computing devices have also been designed to provide an improved user experience. Reducing the noise generated by computing devices is one aspect of improving a user's experience. However, when many of the functions rely on physical inputs at switches and buttons, noise is an inherent byproduct of the operation of the physical inputs. The embodiments set forth herein are provided to minimize the inherent noise generated by such components. Exemplary computing devices using physical inputs and switches in accordance with the described embodiments can include, but are not limited to, televisions, remote controls, laptop computers, desktop computers, portable audio players, smartphones, cellular phones, tablets, and wearable electronic devices, just to name a few.

Noise is essentially unwanted sound. Sound is a vibration that propagates as wave through a medium. As such, sound can be characterized as having at least a frequency and amplitude. Sound that is perceptible to humans has frequencies ranging from about 20 Hz to 20,000 HZ, or 20 kHz. Pitch is the repetitive nature of sound vibrations and thus is related to frequency. High pitches, or frequencies in the 2 kHz and up range, are often perceived as less desirable from a user experience perspective and can be categorized as noise. Thus, reducing the pitch of a sound can improve the user experience. Similarly, the loudness of sound, or the amplitude, also contributes to noise. Thus, eliminating particularly loud and particularly high pitch sounds is desirable to improve a user's experience.

Embodiments of switches herein can reduce the unwanted sound generated by operation of the switch. As such, embodiments can include a first contact that, when brought into contact with a second contact, completes a circuit that can generate a signal to be sent to a processor or other computing circuitry for operation of an electronic device. The first contact and metal contact can be formed of an electrically conductive material sufficient for completing the circuit. In some embodiments the first contact and second contacts can be metal. The first contact can be suspended away from the second contact in various ways, for instance by springs or a complaint portion. In some embodiments the switch can have a flexible surface formed over the second contact and the flexible surface can suspend the first contact. In some embodiments the flexible surface can be a flexible dome. In some embodiments the flexible surface can be formed of metal.

When a force is applied to the flexible surface, the flexible surface can collapse, which allows the first contact to move toward and come into contact with the second contact. The shape and material of the surface can provide a mechanical feedback in the form of a release because the flexible surface can be configured to collapse only when a certain level of force is applied to the flexible surface. This mechanical feedback response can be associated with a click ratio. A click ratio, discussed in greater detail below, is in essence a measure of the response of the flexible surface as a force is applied to the flexible surface and as it relates to a distance of travel of the flexible surface. It has been discovered that higher click ratios are more desirable to users. By way of example a small click ratio might feel like depressing foam, which from the perspective of depressing a button is less desirable and provides very little to no "click", where a high click ratio will provide an initial resistance and build up of potential energy that once overcome, is released and perceived by a user a strong "click." That said, higher click ratios also tend to generate sound in the range that is less desirable to humans. Flexible surfaces formed of metals tend to generate better click ratios but also generate noise when collapsing and when the switch contacts impact each other. In other words a higher click ratio is conventionally believed to be associated with more noise generated by the switch. One advantage of the embodiments of the present application is the ability for a switch to maintain a relatively high click ratio while also minimizing or reducing the unwanted sound generated by the operation of the switch, thus departing from the conventional wisdom for the relationship between click ratio and sound generation for switches.

To reduce the unwanted sound or noise, a dampening pad can be coupled to the flexible dome. The dampening pad can operate to absorb some of the sound generated when the surfacing contact impacts the second contact. In some embodiments the dampening pad is made from a polymer material. In some embodiments the material of the dampening pad is rubber. In some embodiments, the material of the dampening pad is silicone. The dampening pad is capable of reducing both the frequency and amplitude of the sound generated by the operation of the switch.

In conventional switches, a lower dome can be formed under the flexible dome made of metal and around the second contact. This lower dome can be formed of a rubber type material that can provide a soft impact surface for once the flexible dome has collapsed and the switch contact bottoms out at the end of its travel. The lower dome is used to lessen the impact of the switch when it bottoms out on a hard surface because some dampening of the impact provides a more pleasant feel. The dampening pad of the describe embodiments can be configured to provide the dampening of the conventional lower dome and therefore can eliminate the need to the lower dome. Thus, in some embodiments, the noise dampening pad can provide more than one benefit, a first being reducing the noise associated with the impact made between the first contact and the contact as well as a second being absorbing some of the impact force that a user would feel when the first contact impacts the second contact.

More specifically, some embodiments can include a dome switch assembly including a base plate that carries a first contact, and a flexible surface connected to the base plate, the flexible surface formed of a metal material in the shape of a dome. The assembly can include a second contact coupled to the flexible surface, and a sound-dampening pad coupled to the flexible surface and formed of a material having noise-dampening properties, wherein when at least a threshold amount pressure is applied to the flexible surface, the flexible surface changes from the dome shape to a collapsed shape allowing the first and second contact to touch, wherein the sound dampening pad absorbs at least some acoustic energy emitted by the touching of the first and second contacts.

In some embodiments the sound-dampening pad absorbs at least some acoustic energy emitted by the flexible surface when it changes from the dome shape to the collapsed shape. In some embodiments the sound-dampening pad is configured to absorb some of an impact force of the first contact coming into contact with the second contact. In some embodiments the sound-dampening pad is coupled to an outer portion of the flexible surface. In some embodiments the sound-dampening pad is made from a polymer material. In some embodiments the sound-dampening pad material has a shore hardness ranging from about 40 A-80 A. In some embodiments the sound-dampening pad is made of silicone. In some embodiments the sound-dampening pad has a generally rectangular cross section.

Some embodiments can include a computing device having a processor, a housing configured to carry the processor, and a dome switch in communication with the processor. The dome switch can include a flexible surface coupled to a switch base, the flexible surface having a dome shape and configured to change to a collapsed shape under a force of pressure, a first contact coupled to the flexible surface and configured to strike a second contact arranged opposite the first contact when the flexible surface changes to the collapsed shape to complete a circuit, and a noise-dampening pad coupled to the flexible surface and configured to absorb acoustical energy released when the first contact strikes the second contact.

In some embodiments the noise-dampening pad absorbs at least some acoustic energy emitted by the flexible surface when it changes from the dome shape to the collapsed shape. In some embodiments the noise-dampening pad is configured to absorb at least part of an impact force generated when the first contact strikes the second contact. In some embodiments the processor is in communication with a keyboard of the computing device and the dome switch is connected to a key of the keyboard. In some embodiments the dome switch is configured to cause the processor to perform a function when the circuit is completed. In some embodiments the noise-dampening pad is made of a polymer. In some embodiments the flexible surface is made of metal. In some embodiments the dome switch is connected to a track pad of the computing device. In some embodiments the computing device is portable and the dome switch is connected to an input button.

Some embodiments can include a method for assembling a dome switch including, arranging a first contact carried by a collapsible metal dome opposite a second contact, the collapsible metal dome being configured to collapse under an applied force allowing the first and second contacts to touch, electrically coupling the first contact and second contact to a process such that when the contacts touch a circuit is completed and a signal is sent to the processor, and coupling a sound dampening pad to the collapsible dome, the sound dampening pad being formed of a material having sound-dampening characteristics and configured to absorb acoustical energy released when the first contact touches the second contact due to the collapsing of the collapsible metal dome under an applied force.

In some embodiments the sound-dampening pad is configured to absorb acoustic energy released by the metal dome when the collapsible metal dome collapses under the applied force. In some embodiments the sound-dampening pad is configured to absorb some of an impact force generated when the set of contacts touch.

These and other embodiments are discussed below with reference to FIGS. 1A-6; however, those skilled in the art will readily appreciate that the detailed description given herein with respect to these figures is for explanatory purposes only and should not be construed as limiting.

FIG. 1A illustrates a perspective view of one type of computing device 108 that can include a button 110 that is arranged to receive input from a user of the computing device 108. The computing device 108 can be any computing device not limited to a cellular phone, laptop computer, tablet computer, television, desktop computer, media player, remote control, watch, or any other device suitable for incorporating a switch. The button 110 can include and utilize switches of the described embodiments herein.

Figure 1B:
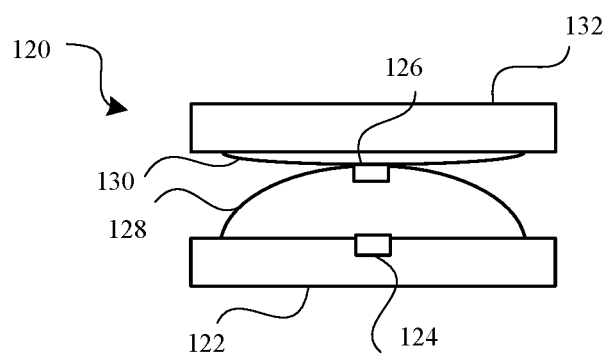
FIG. 1B illustrates one type of conventional switch often used in computing devices.

FIG. 1B illustrates a diagram of a portion of a conventional switch 120. As shown, switch 120 can have a switch base 122 that carries a second contact 124. A flexible surface 128 is connected to the switch base 122. The flexible surface 128 is also connected to a first contact 126. The switch 120 can operate such that the second contact 124 and the first contact 126 touch each other when an amount of pressure is applied to a switch plate 132. When the pressure is applied to the switch plate 132, the flexible surface 128 can collapse. The collapsing of the flexible surface 128 allows first contact 126 to come into contact with the second contact 124. The collapsing of the flexible surface and contact between the first contact 126 and second contact 124 provides some amount of mechanical energy back to the switch plate 132. As a result, a user depressing the switch 120 will be able to feel when a setting of the switch 120 has been activated. Since second contact 124 and first contact 126 tend to be hard electrically conductive materials, such as metal, that can complete an electrical circuit when the switch is activated for sending a signal to a processor of the computing device in which the switch 120 is used, the impact between the first contact 126 and second contact 124 can be abrupt. A "lower" dome can be arranged under flexible surface 128 (not shown here) in some conventional switches. Alternatively, and as shown here, lower dome 130 can be inverted and arranged above flexible surface 128. At any rate, lower dome 130 can be configured to absorb some of the impact force created when the first contact 126 contacts the second contact 124. The lower dome can be formed of a domed flexible surface much like the flexible surface 128.

Figure 2A:
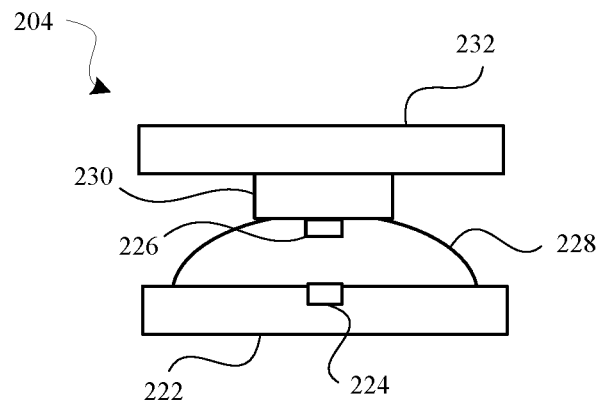
FIG. 2A illustrates one embodiment of a switch in accordance with the present invention in a resting state.

FIG. 2A illustrates a diagram of a portion of a switch 220 in accordance with the described embodiments of the present invention. As illustrated in FIG. 2A, the switch 210 can include a base plate 222 that carries a second contact 224. A flexible surface 228 can be connected to the base plate 222. Flexible surface can be made of a metal material and can be formed in the shape of a dome having an internal volume such that when a certain amount pressure is applied, the flexible surface can yield and change shape and thus collapse. A first contact 226 can be connected to the flexible surface 228. A dampening pad 230 having noise-dampening properties can be coupled to the flexible surface 228. In some embodiments, the dampening pad 230 can be coupled to the first contact 226, which is carried by the flexible surface 228. In some embodiments, the dampening pad 230 can also be coupled directly to the flexible surface 228. The switch 220 can also have a switch plate 232 connected to the dampening pad 230. As shown in FIG. 2A, in the rest position, the second contact 224 and the first contact 226 can be separated. The separation of the contacts can be in part due to an amount of potential energy associated with the flexible surface 228. In this way, a weight of the switch plate 232 can be arranged to not overcome the potential energy of the flexible surface 228 without some external force.

Figure 2B:
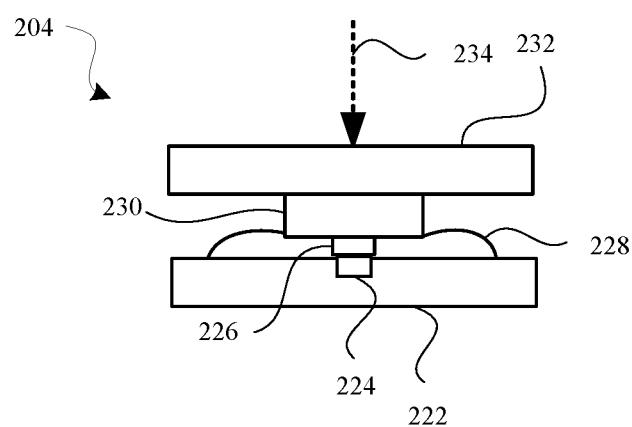
FIG. 2B illustrates the switch of FIG. 2A in a depressed state.

FIG. 2B illustrates a diagram of the switch 220 being acted on by a force 234. The switch 220 can be arranged such that the force 234 can be enough to overcome the potential energy associated with the flexible surface 228. As a result, the second contact 224 and the first contact 226 touch. Because of the potential energy within the system is overcome by the external force, there is an impact when the first contact 226 touches the second contact 224. Second contact 224 and the first contact 226 touch each other and complete an electrical circuit configured to provide a signal to a processor. The collapsing of flexible surface 228 can provide some amount of mechanical energy back to the switch plate 232 because of the release of potential energy. Because the dampening pad 230 is coupled to the first contact 226 and flexible surface 228, the dampening pad 230 absorbs some of the released potential energy, which is, in part, released in the form of sound waves and in part released in a resulting impact force back to the switch plate 232.

The mechanical feedback from the collapsing of flexible surface 228 can be characterized as a click ratio discussed in greater detail below. Some additional mechanical feedback can be provided when the first contact 226 impacts the second contact 224. This additional feedback is also discussed in greater detail is related to the feedback profile and the click ratio of the switch 220.

Figure 2C:
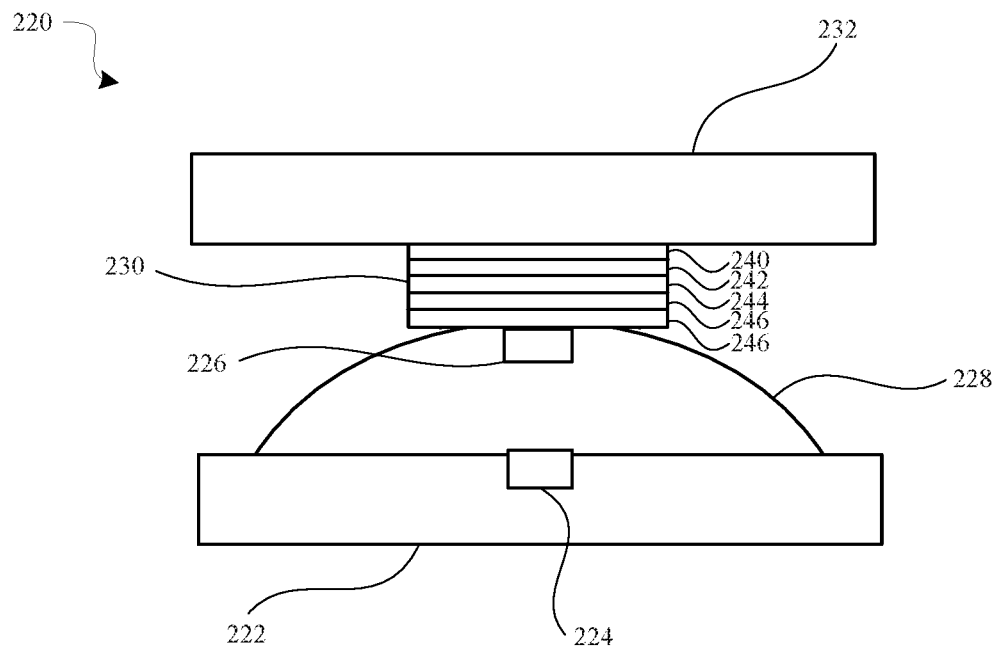
FIG. 2C illustrates an embodiment of a dampening pad that can include a vertically layered stack that can include layers.
Figure 2D:
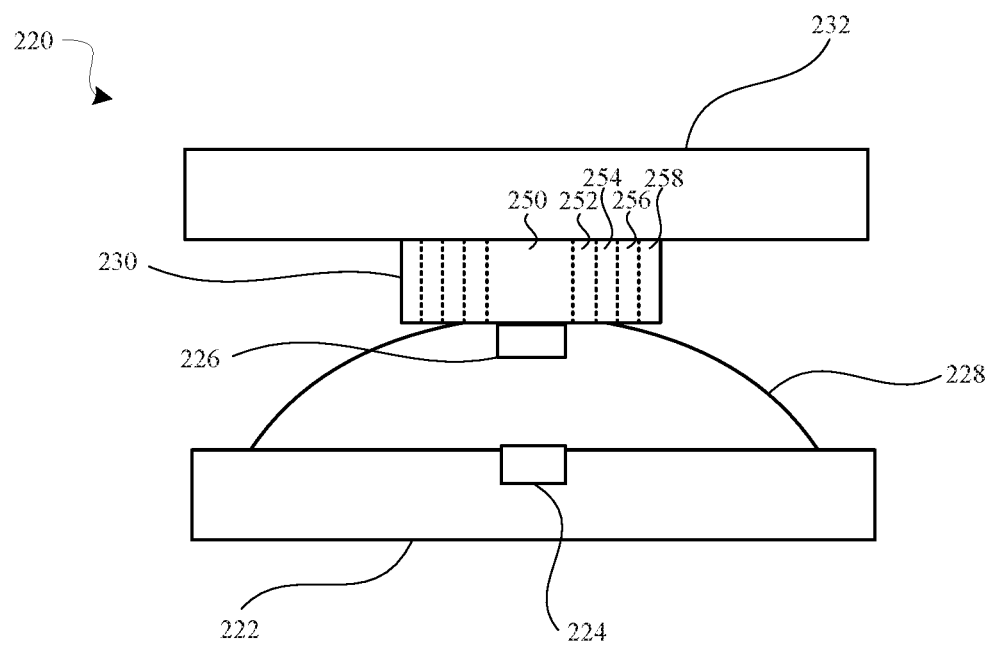
FIG. 2D illustrates an embodiment of a dampening pad that can include a concentrically layered stack the can include layers.

That said, first contact 226 and second contact 224 can be electrical leads that complete a circuit upon contact for operation of the switch. As such, first contact 226 and second contact 224 can be formed of an electrically conductive material. The material also needs to be fatigue resistance to withstand the repeated applied loads that will be applied to the switch 220. As such, the first contact 226 and second contract 224 can be formed of a metal material. When the two metals of the first contact 226 with the second contact 224, impact one another, under an applied pressure, the impact force generates a sound. Switch 220 can have a dampening pad 230 coupled to the flexible surface and/or the first contact 226 to absorb the sound generated from the impact. Dampening pad 320 can have a size and shape configured so that it can be arrange between flexible surface 228 (and/or first contact 226) and switch plate 232. As shown dampening pad 230 can have a substantially rectangular cross-section. In various embodiments dampening pad 230 can have alternative cross-sectional shapes such as a donut shape or a star shape. The dampening pad 230, at the intersection of the dampening pad 230 and flexible surface 228, can be shaped to conform to the domed flexible surface in the un-collapsed state. In some embodiments, the dampening pad 230 at the intersection of the dampening pad 230 and flexible surface 228, can be shaped to conform to the flexible surface 228 in the collapsed state. Dampening pad 230 can be formed of a material that adequately absorbs at least some of the sound generated when the first contact 226 and second contact 224. Also, dampening pad 230 can be formed of a complaint material that is resistant to creep as well has good hysteresis, which for the purpose of the dampening pad 230 is the ability to return to its initial state with minimal lag. As such dampening pad 230 can be formed of polymer material, such as a rubber, or an elastomer. In some embodiments, dampening pad 230 can be formed of a silicone material. In some embodiments, dampening pad 230 can be formed of material having flourene. In some embodiments dampening pad 230 can be formed of a material having TFE or nitrile. In some embodiments the sound-dampening pad has a shore hardness ranging from about 40-80 A, where shore hardness is a measurement of durometer, which is one on of several measures of hardness of polymers, elastomers and rubbers. The "A" shore scale is used for softer plastics. In some embodiments dampening pad 230 can be a hybrid composite of materials concentrically layered or in a vertically layered stack. FIG. 2C illustrates an embodiment of dampening pad 230 that can include a vertically layered stack that can include layers 240, 242, 244, 246, and 248. FIG. 2D illustrates an embodiment of dampening pad 230 that can include a concentrically layered stack that can include layers 250, 252, 254, 256, and 258. Because of composition and configuration of the dampening pad 230, dampening pad 230 can absorb other sound generated within the switch including some of the sound generated when flexible surface 228 collapses from a dome shape to a collapsed state.

Since in some embodiments, flexible surface 228 can be formed of a metal in the shape of a dome, the flexible surface 228 is capable of storing potential energy that must be overcome for the flexible surface 228 to collapse. Flexible surface 228 needs to be fatigue resistance to withstand the repeated applied loads that will be applied to the switch 220. When the flexible surface 228 does collapse some of the potential energy is released as sound. The dampening pad 230 can absorb at least some of this sound. In addition, dampening pad 230 can absorb some of the impact force generated when first contact 226 impacts second contact 224, and as such, the lower dome 130 of conventional switch 120 can be eliminated, simplifying the design and manufacturing of switches of the described embodiments. Elimination of the lower dome 130 also allows the height of the flexible surface 228 to be reduced, which allows the length in which the flexible surface collapses to be reduced. This reduction in collapsing length can improve reliability and lifespan on the flexible surface 228. Despite including dampening pad 230 in switch 220, switch 220 can still have the same click ratio in the range of about 72% to 75% of conventional switches.

Figure 3:
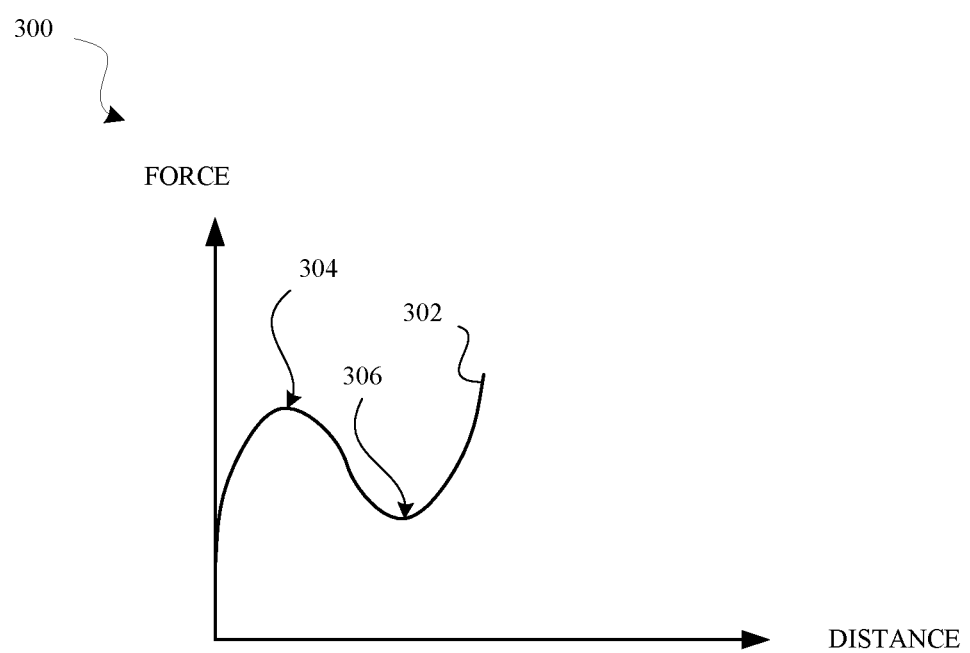
FIG. 3 illustrates a feedback profile of a switch in accordance with the described embodiments.

FIG. 3 illustrates a plot 300 of a feedback force profile 302 that can be received by a user as the switch 220 is depressed over a certain distance. The axes of the plot 300 are "feedback force" and "distance," where feedback force is associated with an amount of mechanical resistance exhibited by the switch 220 as the switch is depressed. The "distance" axis is associated with an amount by which the switch 220 is depressed. A peak 304 illustrates a point at which the flexible surface 228 of the switch 220 collapses. A valley 306 illustrates a point at which the first contact 226 impacts second contact 224. In the case of the convention switch 120, lower dome 130 makes it so the valley 306 has a smooth curvilinear transition. In the conventional switch 120, the absence of a lower dome 130 would result in valley 306 having a sharp transition or spike at this point of the feedback profile 302. In the switch 220 of the present invention dampening pad absorbs some of the impact force otherwise associated with valley 306 and therefore provides a curvilinear transition as shown.

Switches with relatively higher switch ratios will have a larger change between peak 304 and valley 306. In other words, a large peak to valley change signifies a larger click ratio. Lower click ratios will have near equal peak 304 and valley 306. Dampening pad 230 of the described embodiments combined with the flexible surface 228 configured as describe, 1) provides a relatively high click ratio, 2) reduces the sound generated by the switch when the first contact 226 impacts the second contact 224 and 3) absorbs some of the impact force generated by the switch when the first contact 226 impacts the second contact 224. This translates to a switch that is pleasing to use, in that it has high-click ratio, low noise and gentle impact at the bottom of the depression of the switch, as seen in the feedback profile 302, all of which provide an enhanced user experience.

Figure 4A:
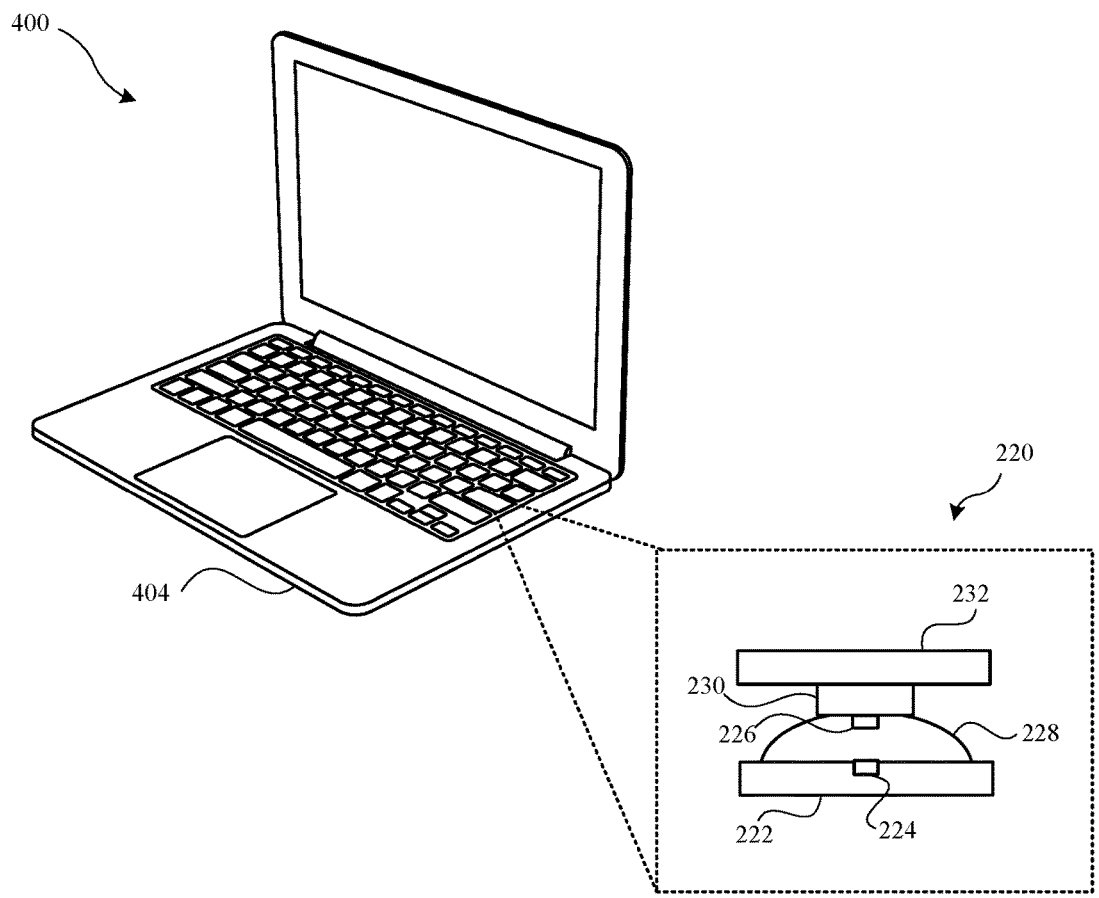
FIG. 4A illustrates an exemplary laptop including switches of the describe embodiments.
Figure 4B:
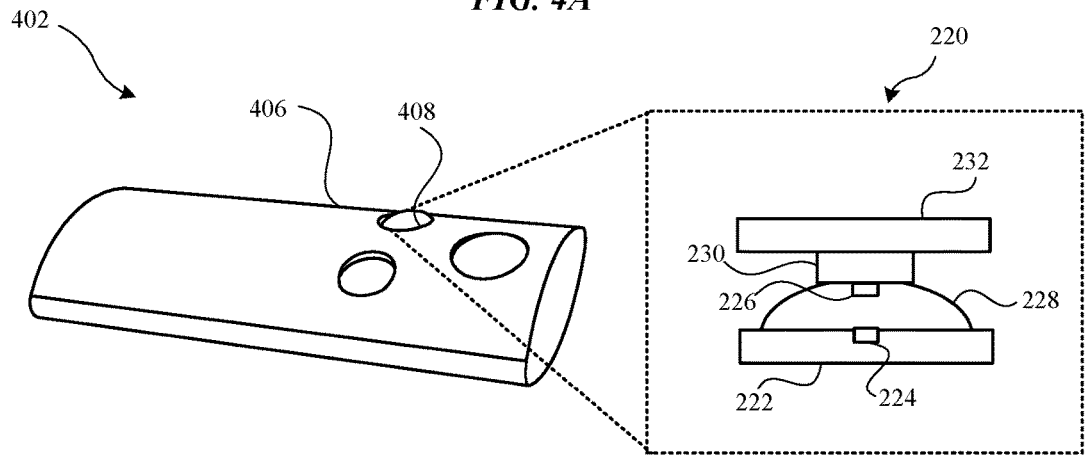
FIG. 4B illustrates an exemplary remote control including switches of the describe embodiments.
Figure 5:
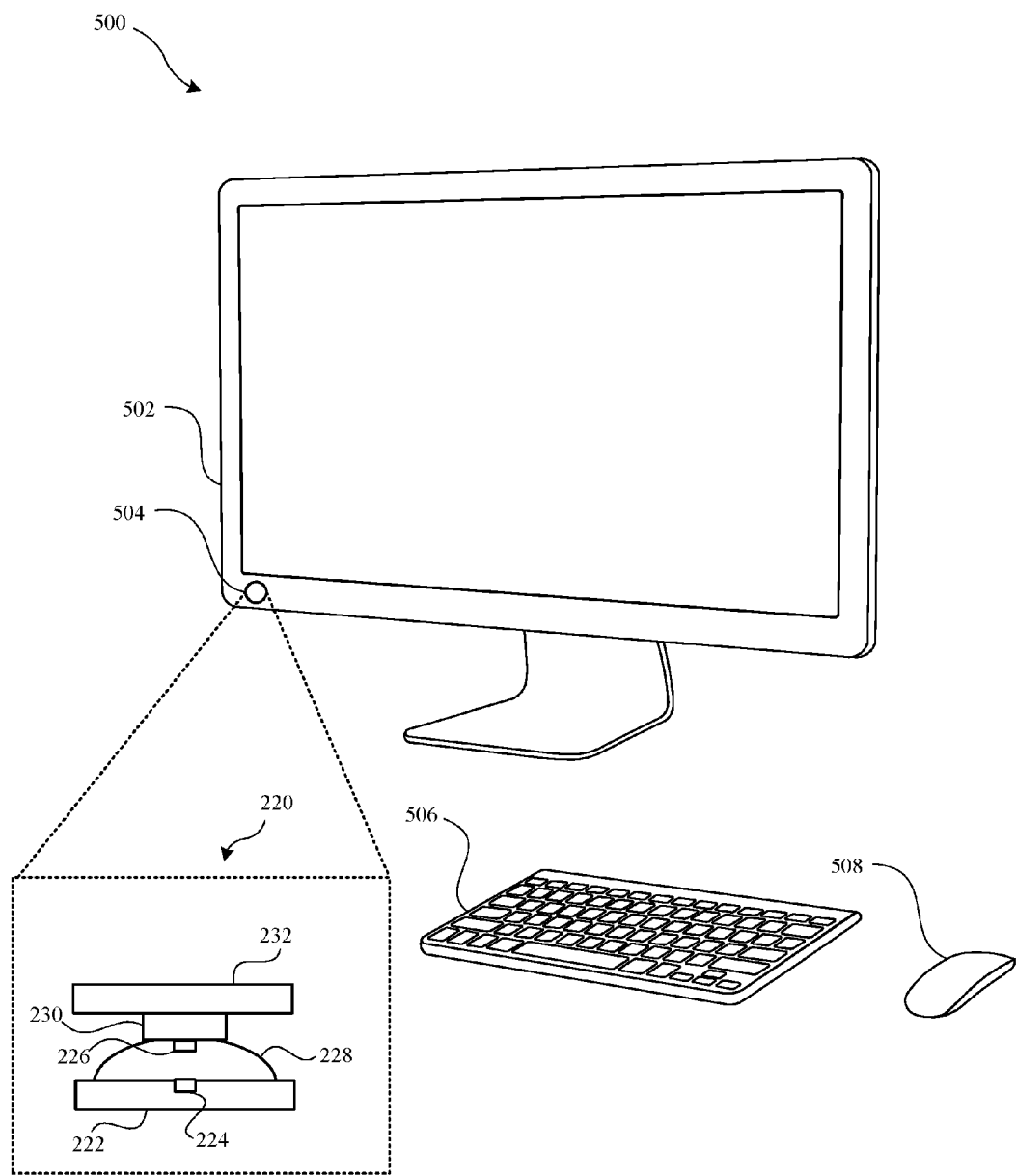
FIG. 5 illustrates an exemplary desktop computer including switches of the describe embodiments.

FIGS. 4A-5 illustrate various different types of devices that can utilize switches of the present invention as described in the various embodiments. FIG. 4A illustrates a perspective view 400 of a laptop 404 that can include the switch 220 discussed herein. Switch 220 can be used in keys of a keyboard and therefore can provide a less noisy keyboard for a laptop 404, that is more pleasant for the user and can allow for use of the laptop in places where quite operation of the laptop is desirable, for example. FIG. 4B illustrates a perspective view 402 of a remote control 406 that can include the switch 220 discussed herein. The remote control 406 can include a button 408, which can be connected to the switch 220.

FIG. 5 illustrates a perspective view 500 of a computing system that includes a computing device 502, a keyboard 506, and a mouse or track pad 508 that can each include the switch 220. For example, the computing device 502 can include a power button 504 that is connected to the switch 220. The keyboard 506 can also include the switch 220, as discussed with respect to FIG. 4A. The mouse or track pad 508 can also include the switch 220.

Figure 6:
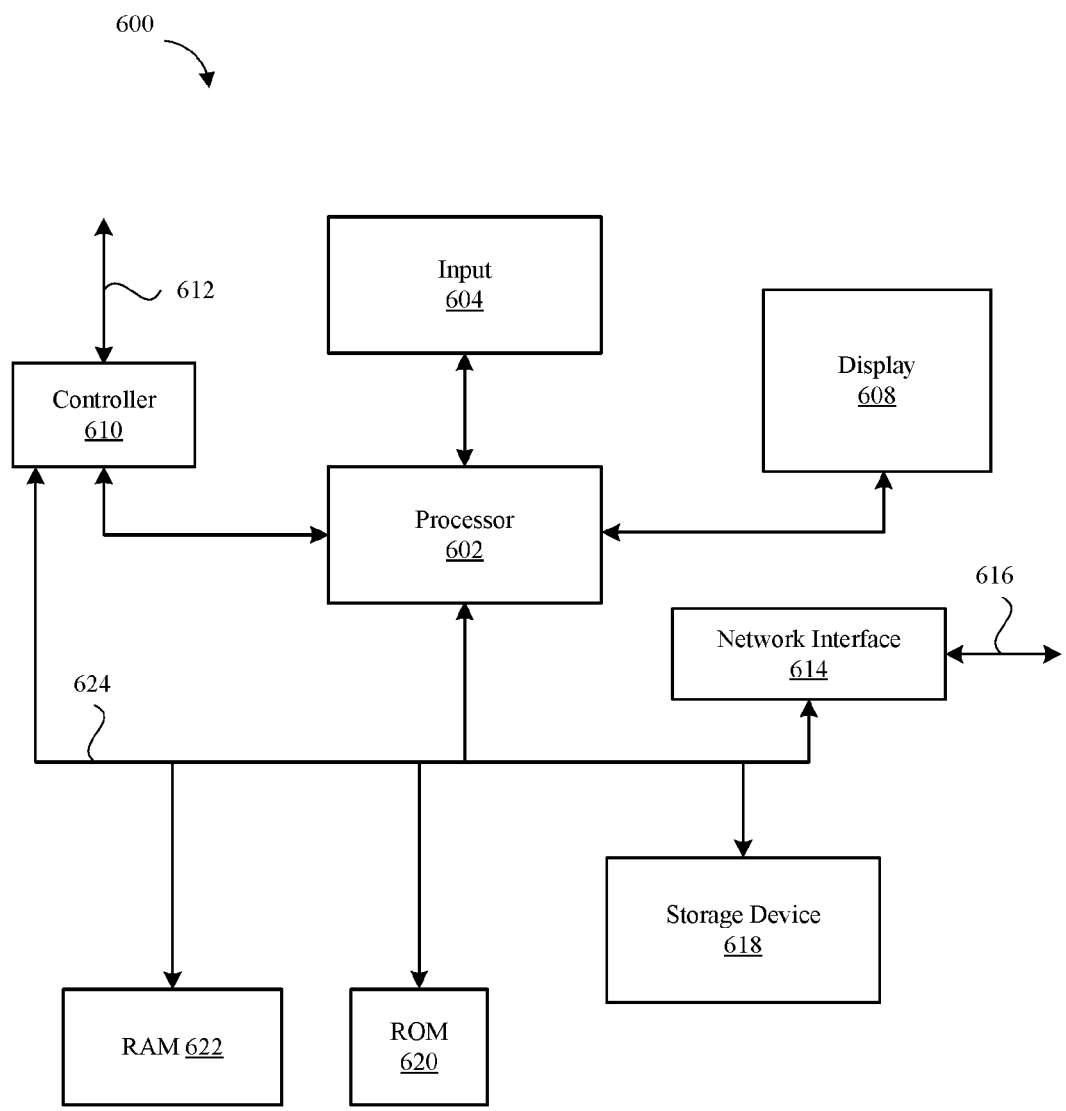
FIG. 6 illustrates block diagram of a computing device that can include a switch of the describe embodiments.

FIG. 6 is a block diagram of a computing device 600 that can use the switches in the disclosed embodiments. It will be appreciated that the components, devices or elements illustrated in and described with respect to FIG. 6 may not be mandatory and thus some may be omitted in certain embodiments. The computing device 600 can include a processor 602 that represents a microprocessor, a coprocessor, circuitry and/or a controller for controlling the overall operation of the computing device 600. Although illustrated as a single processor, it can be appreciated that the processor 602 can include a plurality of processors. The plurality of processors can be in operative communication with each other and can be collectively configured to perform one or more functionalities of the computing device 600 as described herein. In some embodiments, the processor 602 can be configured to execute instructions that can be stored at the computing device 600 and/or that can be otherwise accessible to the processor 602. As such, whether configured by hardware or by a combination of hardware and software, the processor 602 can be capable of performing operations and actions in accordance with embodiments described herein.

The computing device 600 can also include a user input device 604 that allows a user of the computing device 600 to interact with the computing device 600. For example, the user input device 604 can take a variety of forms, such as a button, keypad, dial, touch screen, audio input interface, visual/image capture input interface, input in the form of sensor data, etc. Such user input can utilize the switches of the described embodiments herein. Still further, the computing device 600 can include a display 608 (screen display) that can be controlled by the processor 602 to display information to a user. A controller 610 can be used to interface with and control different equipment through an equipment control bus 612. The computing device 600 can also include a network/bus interface 614 that couples to a data link 616. The data link 616 can allow the computing device 600 to couple to a host computer or to accessory devices. The data link 616 can be provided over a wired connection or a wireless connection. In the case of a wireless connection, network/bus interface 614 can include a wireless transceiver.

The computing device 600 can also include a storage device 618, and a storage management module that manages one or more partitions (also referred to herein as "logical volumes") within the storage device 618. In some embodiments, the storage device 618 can include flash memory, semiconductor (solid state) memory or the like. Still further, the computing device 600 can include Read-Only Memory (ROM) 620 and Random Access Memory (RAM) 622. The ROM 620 can store programs, code, instructions, utilities or processes to be executed in a non-volatile manner. The RAM 622 can provide volatile data storage, and store instructions related to components of the storage management module that are configured to carry out the various techniques described herein. The computing device 600 can further include data bus 624. The data bus 624 can facilitate data and signal transfer between at least the processor 602, the controller 610, the network/bus interface 614, the storage device 618, the ROM 620, and the RAM 622. The various aspects, embodiments, implementations or features of the described embodiments can be used separately or in any combination.

Figure 7:
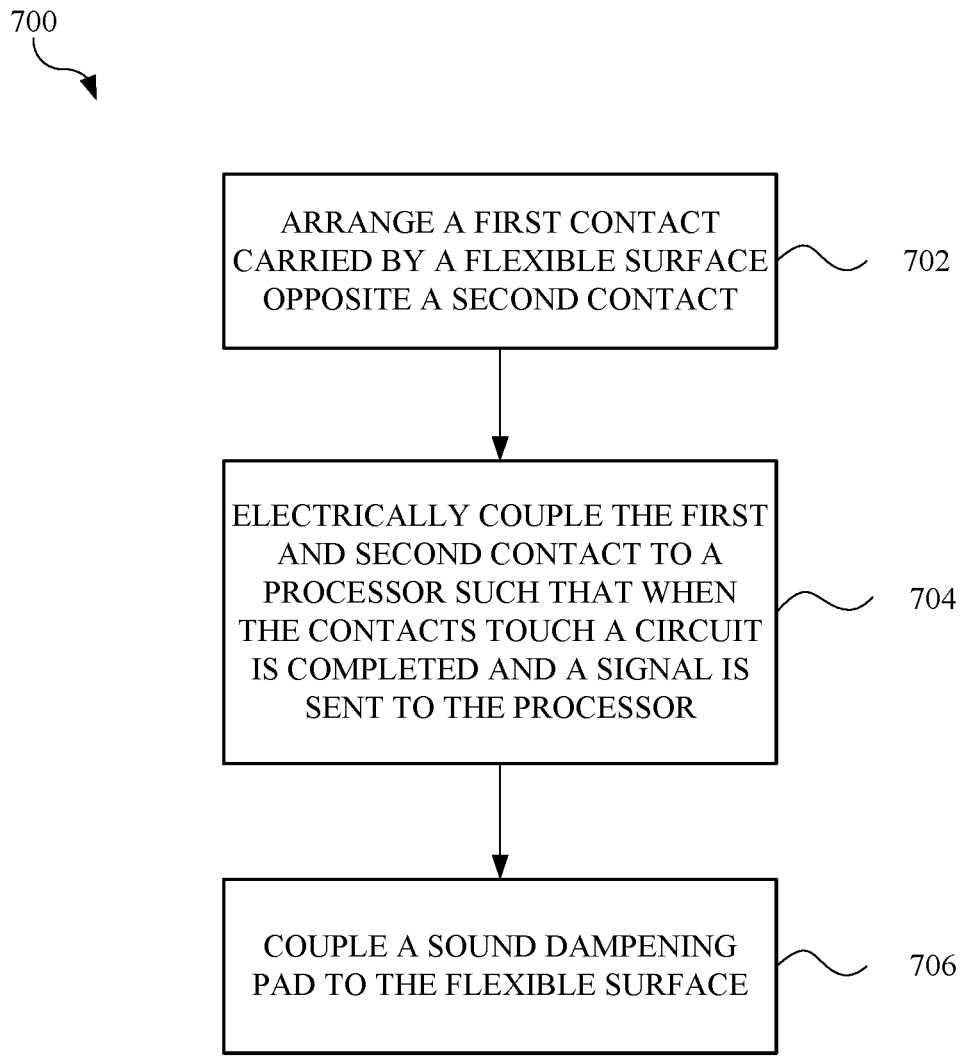
FIG. 7 illustrates a block diagram of a method for assembling switches of the described embodiments.

FIG. 7 illustrates a block diagram of a method 700 for assembling switches of the described embodiments. In a step 702 a first contact carried by the flexible surface can be arranged opposite a second contact. As described in the various embodiments, the flexible surface can be configured to collapse under an applied force allowing the first and second contacts to touch. In a step 704 the first contact and second contact can be electrically coupled to a process such that when the contacts touch a circuit is completed and a signal is sent to the processor. In a step 706 a sound dampening pad can be coupled to the flexible surface, the sound dampening pad being formed of a material having sound-dampening characteristics and configured to absorb acoustical energy released when the first contact touches the second contact due to the collapsing of the flexible surface under an applied force.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A dome switch assembly, comprising:
    a base plate that carries a first contact;
    a flexible surface connected to the base plate, the flexible surface formed of a metal material in the shape of a dome;
    a second contact coupled to the flexible surface; and
    a sound-dampening pad coupled to an outer portion of the flexible surface and formed of a hybrid composite of materials arranged in a layered stack, the hybrid composite of materials having noise-dampening properties, wherein when at least a threshold amount pressure is applied to the flexible surface, the flexible surface changes from a dome shape to a collapsed shape allowing the first and second contacts to touch, wherein the sound dampening pad absorbs at least some acoustic energy emitted by the touching of the first and second contacts.

2. The dome switch assembly of claim 1, wherein the sound-dampening pad has a generally rectangular cross section.

3. The dome switch assembly of claim 1, wherein the layered stack is arranged concentrically.

4. The dome switch assembly of claim 1, wherein the layered stack is arranged vertically.

5. The dome switch assembly of claim 1, wherein the sound-dampening pad absorbs at least some acoustic energy emitted by the flexible surface when it changes from the dome shape to the collapsed shape.

6. The dome switch assembly of claim 5, wherein the sound-dampening pad is configured to absorb some of an impact force of the first contact coming into contact with the second contact.

7. The dome switch assembly of claim 1, wherein the hybrid composite of materials comprises a polymer material.

8. The dome switch assembly of claim 7, wherein the sound-dampening pad has a shore hardness ranging from about 40 A-80 A.

9. The dome switch assembly of claim 8, wherein the hybrid composite of materials comprises silicone.

10. A computing device comprising:
a processor;
a housing configured to carry the processor; and
a dome switch in communication with the processor, the dome switch comprising:
a metal dome coupled to a switch base and configured to buckle under a force of pressure,
a first contact coupled to the metal dome and configured to strike a second contact arranged opposite the first contact when the metal dome buckles, and
a noise-dampening pad coupled to an outer portion of the metal dome and formed of a hybrid composite of materials arranged in a layered stack, the noise-dampening pad configured to reduce a sound frequency and pitch of a sound wave generated when the first contact strikes the second contact.

11. The computing device of claim 10, wherein the first contact is made of metal.

12. The computing device of claim 10, wherein the dome switch is connected to a track pad of the computing device.

13. The computing device of claim 10, wherein the computing device is portable and the dome switch is connected to an input button.

14. The computing device of claim 10, wherein the noise-dampening pad absorbs at least some acoustic energy emitted by the metal dome when the metal dome buckles.

15. The computing device of claim 14, wherein the noise-dampening pad is configured to absorb at least part of an impact force generated when the first contact strikes the second contact.

16. The computing device of claim 10, wherein the processor is in communication with a keyboard of the computing device and the dome switch is connected to a key of the keyboard.

17. The computing device of claim 16, wherein the dome switch is configured to cause the processor to perform a function when a circuit associated with the dome switch is completed.

18. A method for assembling a dome switch comprising:
arranging a first contact carried by a collapsible metal dome opposite a second contact, the collapsible metal dome being configured to collapse under an applied force allowing the first and second contacts to touch;
electrically coupling the first contact and second contact to a processor such that when the contacts touch a circuit is completed and a signal is sent to the processor; and
coupling a sound-dampening pad to an outer portion of the collapsible metal dome, the sound-dampening pad being formed of a hybrid composite of materials arranged in a layered stack, the sound-dampening pad configured to absorb acoustical energy released when the first contact touches the second contact due to the collapsing of the collapsible metal dome under the applied force.

19. The method of claim 18, wherein the sound-dampening pad is configured to absorb acoustic energy released by the collapsible metal dome when the collapsible metal dome collapses under the applied force.

20. The method of claim 18, wherein the sound-dampening pad is configured to absorb some of an impact force generated when the contacts touch.

* * * * *